(12) United States Patent
Sakai

(10) Patent No.: US 7,951,617 B2
(45) Date of Patent: May 31, 2011

(54) GROUP III NITRIDE SEMICONDUCTOR STACKED STRUCTURE AND PRODUCTION METHOD THEREOF

(75) Inventor: Hiromitsu Sakai, Ichihara (JP)

(73) Assignee: Showa Denko K.K., Tokyo (JP)

( * ) Notice: Subject to any disclaimer, the term of this patent is extended or adjusted under 35 U.S.C. 154(b) by 5 days.

(21) Appl. No.: 11/543,950

(22) Filed: Oct. 6, 2006

(65) Prior Publication Data

US 2007/0080369 A1 Apr. 12, 2007

Related U.S. Application Data

(60) Provisional application No. 60/726,526, filed on Oct. 14, 2005.

(30) Foreign Application Priority Data

Oct. 6, 2005 (JP) .................................. 2005-293570

(51) Int. Cl.
*H01L 21/00* (2006.01)
(52) U.S. Cl. ................. 438/22; 438/29; 438/46; 438/47; 257/79; 257/80; 257/E21.085; 257/E33.023; 257/E33.028
(58) Field of Classification Search .................... 438/22, 438/29, 46–47, 604, 606; 257/79, 80, E21.085, 257/E21.701, E33.049, E33.023, E31.059, 257/E33.001, E33.028
See application file for complete search history.

(56) References Cited

U.S. PATENT DOCUMENTS

| 5,122,845 | A | | 6/1992 | Manabe et al. |
| 5,290,393 | A | | 3/1994 | Nakamura |
| 6,165,812 | A | * | 12/2000 | Ishibashi et al. ................. 438/46 |
| 6,229,151 | B1 | | 5/2001 | Takeuchi et al. |
| 6,342,405 | B1 | * | 1/2002 | Major et al. ..................... 438/46 |
| 6,569,704 | B1 | | 5/2003 | Takeuchi et al. |
| 6,597,023 | B2 | * | 7/2003 | Shibata et al. ................. 257/184 |
| 6,738,175 | B2 | * | 5/2004 | Morita et al. .................. 359/248 |
| 6,849,472 | B2 | | 2/2005 | Krames et al. |
| 6,852,161 | B2 | | 2/2005 | Urashima et al. |

(Continued)

FOREIGN PATENT DOCUMENTS

EP 0 497 350 B2 8/1992

(Continued)

OTHER PUBLICATIONS

Tetsuya Takeuchi, et al.; "Quantum-Confined Stark Effect due to Piezoelectric Fields in GaInN Strained Quantum Wells"; Jpn. J. Appl. Phys.; vol. 36 (1997); Part 2; No. 4A; Apr. 1, 1997; pp. L382-L385.

(Continued)

*Primary Examiner* — David Vu
*Assistant Examiner* — Brandon Fox
(74) *Attorney, Agent, or Firm* — Sughrue Mion, PLLC

(57) ABSTRACT

An object of the present invention is to provide a group III nitride semiconductor stacked structure having a high-quality A-plane group III nitride semiconductor layer on an R-plane sapphire substrate.

The inventive group III nitride semiconductor stacked structure comprises a substrate composed of R-plane sapphire ($\alpha$-$Al_2O_3$), a buffer layer composed of aluminum gallium nitride ($Al_xGa_{1-x}N$: $0 \leq X \leq 1$) formed on said substrate and an underlying layer composed of an A-plane group III nitride semiconductor ($Al_xGa_yIn_zN_{1-a}M_a$: $0 \leq X \leq 1$, $0 \leq Y \leq 1$, $0 \leq Z \leq 1$, and $X+Y+Z=1$; wherein, M represents a group V element other than nitrogen (N), and $0 \leq a \leq 1$) formed on said buffer layer, wherein the pit density of the surface of said underlying layer is $1 \times 10^{10}$ cm$^{-2}$ or less.

5 Claims, 2 Drawing Sheets

U.S. PATENT DOCUMENTS

| | | |
|---|---|---|
| 2001/0010372 A1 | 8/2001 | Takeuchi et al. |
| 2002/0155712 A1 | 10/2002 | Urashima et al. |
| 2004/0051105 A1* | 3/2004 | Tsuda et al. .................. 257/79 |
| 2005/0227453 A1 | 10/2005 | Miki et al. |
| 2005/0274980 A1* | 12/2005 | Miyoshi ...................... 257/192 |
| 2007/0114511 A1* | 5/2007 | Kim et al. ..................... 257/13 |

FOREIGN PATENT DOCUMENTS

| | | |
|---|---|---|
| EP | 0 905 799 A3 | 3/1999 |
| JP | 4-297023 | 10/1992 |
| JP | 7-240374 | 9/1995 |
| JP | 11-112029 | 4/1999 |
| JP | 3026087 | 1/2000 |
| JP | 2003-243302 | 8/2003 |
| WO | WO 02/19369 A1 | 2/2002 |
| WO | WO 03/068699 A1 | 8/2003 |

OTHER PUBLICATIONS

T. Lei, et al.; "Heteroepitaxy, polymorphism, and faulting in GaN thin films on silicon and sapphire substrates"; Jpn. J. Appl. Phys.; vol. 74; No. 7; Oct. 1, 1993; pp. 4430-4437.

Changqing Chen et al.; "Lateral Epitaxial Overgrowth of Fully Coalesced *A*-Plane GaN on *R*-Plane Sapphire"; Jpn. J. Appl. Phys.; vol. 42 (2003); Part 2; No. 6B; Jun. 15, 2003; pp. L640-L642.

* cited by examiner

GROUP III NITRIDE SEMICONDUCTOR STACKED STRUCTURE AND PRODUCTION METHOD THEREOF

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/726,526 filed on Oct. 14, 2005, pursuant to 35 U.S.C. §111(b).

TECHNICAL FIELD

The present invention relates to a group III nitride semiconductor stacked structure, to a production method thereof, more particularly, to a group III nitride semiconductor stacked structure having a high-quality A-plane group III nitride semiconductor layer on an inexpensive R-plane sapphire substrate, and to a production method thereof.

BACKGROUND ART

As group III nitride semiconductors have a direct energy transition band gap equivalent to the region from visible light to ultraviolet light, enabling highly efficient emission of light, they have been commercialized as light-emitting diodes (LEDs) and laser diodes (LDs). In addition, they also have a potential for use as electronic devices capable of providing characteristics which cannot be obtained with conventional group III-V compound semiconductors, such as the appearance of a two-dimensional electron layer, due to the characteristic piezoelectric effects in group III nitride semiconductors, at the heterojunction interface between aluminum gallium nitride (AlGaN) and gallium nitride (GaN).

As group III nitride semiconductors have a dissociation pressure which reaches 2,000 atmospheres at the growth temperature of single crystals, it is difficult to grow single crystals, and the use of single crystals of group III nitride semiconductors as substrates used for epitaxial growth in the manner of other group III-V compound semiconductors is difficult under the present circumstances. Therefore, substrates composed of dissimilar materials such as sapphire ($\alpha$-$Al_2O_3$) single crystals and silicon carbide (SiC) single crystals are used as substrates for epitaxial growth.

Large lattice mismatch is present between these dissimilar substrates and the group III nitride semiconductor crystals epitaxially grown thereon. For example, a lattice mismatch of 16% is present between C-plane sapphire and gallium nitride (GaN), while a lattice mismatch of 6% is present between SiC and gallium nitride. In general, in the case of the existence of a high degree of lattice mismatch such as this, it is difficult to grow crystals directly on a substrate by epitaxial growth and, even if the crystals are grown, crystals with satisfactory crystallinity are not obtained. Therefore, as indicated in Japanese Patent No. 3026087 or Japanese Unexamined Patent Publication No. H4-297023, in the case of epitaxial growth of group III nitride semiconductor crystals on a sapphire single crystal substrate or SiC single crystal substrate using metal organic chemical vapor deposition (MOCVD), a method is typically carried out in which a layer referred to as a low-temperature buffer layer composed of aluminum nitride (AlN) or AlGaN is first deposited on the substrate, followed by epitaxial growth of group III nitride semiconductor crystals thereon at a high temperature.

The use of this buffer layer technology made it possible to produce high-quality group III nitride semiconductor crystals, enabling practical application of a blue-green LED and a violet LD.

In addition, attempts were also made without using the aforementioned low-temperature buffer layer technology (see, for example, International Publication WO 02/17369 and Japanese Unexamined Patent Publication No. 2003-243302). The use of this technology made it possible to obtain highly efficient blue LEDs comparable to low-temperature buffer layer LEDs.

The GaInN emission layer used in blue LEDs has lattice mismatch with respect to GaN and, for example, an extremely large piezoelectric field of about 1 MV/cm has been reported to be normally generated in a $Ga_{0.9}In_{0.1}N$ layer which is grown on the (0001) plane of GaN crystals (see, for example, T. Takeuchi et al., Jpn. J. Phys., Vol. 36 (1997) pp. L382-L385).

In general, if an electric field is present in a quantum well layer, as the energy band of the quantum well layer shifts considerably as the electric field increases, the shapes of the wave functions of electrons and holes deviate mutually and differently, and the integral where both wave functions overlap becomes smaller. In other words, a significant change in optical characteristics occur in the form of a decrease in emission efficiency or absorption efficiency (quantum confinement Stark effect) (see D. A. B. Miller et al., Phys. Rev. Lett., 53 (1984) 2173). Deterioration of device characteristics occurs resulting in problems in devices, such as light-emitting devices, due to this type of piezoelectric field.

In contrast to the external quantum efficiency of group III nitride semiconductor LEDs being 43% for violet and 40% for blue, it is only about 15% for green, thus resulting in a desire to increase the efficiency of green LEDs at long wavelengths. Factors behind the low external quantum efficiency of green LEDs consist of not only poor crystallinity of the emission layer GaInN (crystal deterioration caused by increased In composition), but also the afore-mentioned effects produced by piezoelectric fields due to the use of longer wavelengths.

A method for controlling the piezoelectric field according to the orientation of the growth plane is known as a measure for reducing the piezoelectric field (see, for example, Japanese Unexamined Publication No. H11-112029). According to this method, inclination of the growth orientation reduces the piezoelectric field, and examples of planes in which a piezoelectric field does not occur include the A-plane (11-20) and the M-plane (10-10). A known example of a method for obtaining A-plane (11-20) epitaxial growth involves the application of R-plane sapphire for the substrate (see, for example, Lei et al., J. Appl. Phys., Vol. 80 (1993), p. 4430).

Among sapphire substrates, R-plane substrate has the lowest production cost, and is currently available in sizes of about 8 inches. On the other hand, as routinely used C-plane sapphire substrate is the most difficult type of sapphire substrate to produce while also being expensive, LEDs produced on this substrate are expensive.

Thus, being able to produce LEDs using R-plane sapphire substrates would make it possible to increase the efficiency and reduce the production costs of long-wavelength green LEDs, and is therefore considered to be extremely useful. However, group III nitride semiconductors produced on R-plane sapphire substrates are susceptible to the formation of pits in the surface, and it has been difficult to produce a high-quality group III nitride semiconductor layer on an R-plane sapphire substrate.

Attempts have been made, during GaN growth on an R-plane sapphire substrate, to improve the surface flatness by increasing the thickness of the GaN layer to about 75 μm using growth technologies such as epitaxial lateral overgrowth (see, for example, C. Q. Chen et al., Jpn. J. Appl. Phys., Vol. 42 (2003), p. L640). In the case of epitaxial lateral overgrowth, the process is complex due to the need to form a mask pattern and to repeat the growth several times by re-growing. In addition, a thick film group III nitride semiconductor layer is required, thereby increasing costs.

In addition, an attempt has also been made to introduce a zinc oxide layer between an R-plane sapphire substrate and a group III nitride semiconductor layer (see, for example, Japanese Unexamined Patent Publication No. H7-240374). In this method, as the zinc oxide layer is formed by sputtering, several steps of growth are required.

SUMMARY OF THE INVENTION

An object of the present invention is to provide a group III nitride semiconductor stacked structure having a high-quality A-plane group III nitride semiconductor layer on an R-plane sapphire substrate. In addition, an object of the present invention is to provide a simple production method for a group III nitride semiconductor stacked structure having a high-quality A-plane group III nitride semiconductor layer on an R-plane sapphire substrate.

The present invention provides the following inventions.

(1) A group III nitride semiconductor stacked structure comprising: a substrate composed of R-plane sapphire ($\alpha$-$Al_2O_3$), a buffer layer composed of aluminum gallium nitride ($Al_xGa_{1-x}N$: $0 \leq X \leq 1$) formed on said substrate, and an underlying layer composed of an A-plane group III nitride semiconductor ($Al_xGa_yIn_zN_{1-a}M_a$: $0 \leq X \leq 1$, $0 \leq Y \leq 1$, $0 \leq Z \leq 1$, and $X+Y+Z=1$; wherein, M represents a group V element other than nitrogen (N), and $0 \leq a < 1$) formed on said buffer layer; wherein, the pit density of the surface of said underlying layer is $1 \times 10^{10}$ $cm^{-2}$ or less.

(2) The group III nitride semiconductor stacked structure according to (1) above, wherein the film thickness of the underlying layer is 20 μm or less.

(3) The group III nitride semiconductor stacked structure according to (1) or (2) above, wherein the underlying layer is composed of GaN.

(4) The group III nitride semiconductor stacked structure according to any one of (1) to (3) above, wherein the buffer layer is composed of aluminum gallium nitride ($Al_xGa_{1-x}N$: $0.5 \leq X \leq 1$).

(5) The group III nitride semiconductor stacked structure according to any one of (1) to (4) above, wherein the buffer layer is an island-like crystalline mass.

(6) The group III nitride semiconductor stacked structure according to any one of (1) to (4) above, wherein the buffer layer is a columnar crystal.

(7) The group III nitride semiconductor stacked structure according to (6) above, wherein the columnar crystal is adhered to a substrate so that the lateral plane thereof is roughly perpendicular to the substrate plane.

(8) A production method of a group III nitride semiconductor stacked structure comprising a first step wherein a buffer layer composed of aluminum gallium nitride ($Al_xGa_{1-x}N$: $0 \leq X \leq 1$) is grown on a substrate composed of R-plane sapphire ($\alpha$-$Al_2O_3$), and a second step wherein, an underlying layer composed of an A-plane group III nitride semiconductor ($Al_xGa_yIn_zN_{1-a}M_a$: $0 \leq X \leq 1$, $0 \leq Y \leq 1$, $0 \leq Z \leq 1$, and $X+Y+Z=1$; wherein, M represents a group V element other than nitrogen (N), and $0 \leq a < 1$) is grown on the buffer layer; wherein, the substrate temperature of the second step is raised in three or more stages.

(9) The production method of a group III nitride semiconductor stacked structure according to (8) above, wherein when the substrate temperature in the first stage of the second step is designated as T1, the substrate temperature in the second stage is designated as T2, and the substrate temperature in the third stage is designated as T3, then 700° C.<T1<1050° C., 1000° C.<T2<1100° C., 1100° C.<T3<1200° C., and T1<T2<T3.

(10) The production method of a group III nitride semiconductor stacked structure according to (8) or (9) above, wherein the substrate temperature of the first step is higher than that of the second step.

(11) The production method of a group III nitride semiconductor stacked structure according to any one of (8) to (10) above, wherein the ratio of the group V element (nitrogen) to the group III element in the first step (V/III ratio) is 200 or less (including the case of the V/III ratio being zero).

(12) The production method of a group III nitride semiconductor stacked structure according to any one of (8) to (11), wherein the nitrogen raw material of the first step is a decomposition product of an adhered substance adhered inside a reactor.

(13) The production method of a group III nitride semiconductor stacked structure according to any one of (8) to (12) above, wherein the nitrogen raw material of the second step is ammonia ($NH_3$).

(14) A group III nitride semiconductor stacked structure produced according to the production method according to any one of (8) to (12) above.

(15) A group III nitride semiconductor light-emitting device comprising the group III nitride semiconductor stacked structure according to any one of (1) to (7) and (14) above.

(16) A lamp composed of the group III nitride semiconductor light-emitting device according to (15) above.

According to the present invention, a high-quality yet inexpensive A-plane group III nitride semiconductor layer can be stacked onto an R-plane sapphire substrate using a simple method consisting of controlling the growth temperature of a group III nitride semiconductor. In addition, despite the resulting group III nitride semiconductor stacked structure having a thin group III nitride semiconductor layer of 20 μm or less, it is extremely flat, the surface is extremely flat, it has a pit density of $1 \times 10^{10}$ $cm^{-2}$ or less, and it is extremely useful as a material of an inexpensive and highly efficient light-emitting device.

DETAILED DESCRIPTION OF THE INVENTION

Figure 1:
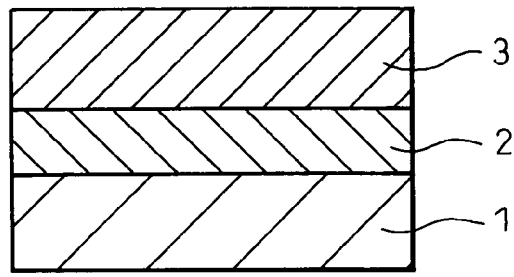
FIG. 1 is a drawing schematically showing a cross-section of one example of a Group III nitride semiconductor stacked structure of the present invention.

FIG. 1 is a drawing schematically showing a cross-section of one example of a group III nitride semiconductor stacked structure of the present invention. In FIG. 1, reference numeral 1 indicates an R-plane sapphire substrate, 2 indicates a buffer layer composed of aluminum gallium nitride, and 3 indicates an underlying layer composed of an A-plane group III nitride semiconductor.

Here, R-plane sapphire refers to the (1-102) plane of ($\alpha$-$Al_2O_3$) crystals. The off angle of the R-plane sapphire refers to the angle formed a perpendicular line rising from the R-plane (R axis) and a perpendicular line rising from the actual crystal plane. In the present invention, the substrate may be on-axis without an off angle or may be provided with an off angle. In the case of providing an off angle, an off angle of 5° or less is preferable. Although there are no particular limitations on the substrate thickness, it is preferably about 100 to 1000 μm. With respect to the surface finish, it is preferable to use a surface having satisfactory flatness in the same manner as a C-plane sapphire substrate (for example, having a TTV of less than 10 μm and surface roughness (Ra) of less than 0.12 nm).

There are no particular restrictions on the growth method for the Group III nitride semiconductor by which a buffer layer 2 and a underlying layer 3 are formed on a R-plane sapphire substrate, and any method known to grow a Group III nitride semiconductor may be applied, such as MOCVD (metal-organic chemical vapor deposition), HVPE (hybrid vapor phase epitaxy) or MBE (molecular beam epitaxy). MOCVD is a preferred growth method from the standpoint of film thickness control and productivity. In MOCVD, hydrogen ($H_2$) or nitrogen ($N_2$) is used as the carrier gas, trimethylgallium (TMGa) or triethylgallium (TEGa) is used as the Ga source (Group III material), trimethylaluminum (TMAl) or triethylaluminum (TEAl) is used as the Al source (Group III material), trimethylindium (TMIn) or triethylindium (TEIn) is used as the In source (Group III material), and ammonia ($NH_3$) or hydrazine ($N_2H_4$) is used as the N source (Group V material). The dopant used, for the n-type layer, may be monosilane ($SiH_4$) or disilane ($Si_2H_6$) as the Si source and germanium gas ($GeH_4$) or an organic germanium compound such as tetramethylgermanium (($CH_3)_4Ge$) or tetraethylgermanium (($C_2H_5)_4Ge$) as the Ge source, for the n-type layer. In MBE, elemental germanium may be utilized as the doping source. For the p-type layer, for example, biscyclopentadienylmagnesium ($Cp_2Mg$) or bisethylcyclopentadienylmagnesium (($EtCp)_2Mg$) is used as the Mg source.

Buffer layer 2 is composed of aluminum gallium nitride ($Al_xGa_{1-x}N$: $0 \leq X \leq 1$). The use of a composition having a high Al content in the form of ($Al_xGa_{1-x}N$: $0.5 \leq X \leq 1$) is preferable from the viewpoint of the flatness of the underlying layer 3 composed of an A-plane group III nitride semiconductor formed thereon. X is more preferably 0.7 or more, and AlN (X=1) is particularly preferable.

The film thickness of buffer layer 2 is preferably 0.001 to 0.5 μm, more preferably 0.005 to 0.5 μm, and particularly preferably 0.005 to 0.3 μm. If the film thickness is within the aforementioned range, the crystal morphology of the A-plane group III nitride semiconductor grown thereon is satisfactory, thereby resulting in improved crystallinity. An excessively thin buffer layer is not desirable since it results in poor surface flatness of the A-plane group III nitride semiconductor stacked thereon. In addition, an excessively thick buffer layer is not practical due to the long growth time.

Buffer layer 2 is preferably composed of island-like crystalline masses. Namely, it is preferably composed of an aggregate of island-like crystalline masses in which island-like granular masses having a width of about 1 to 500 nm and height of about 5 to 100 nm are densely packed. Composing the buffer layer with island-like crystals is thought to facilitate the retention of metallic crystals and liquid droplets therein due to the increased number of grain boundaries in the crystal layer, which has the effect of allowing the buffer layer to function as a layer having a greater excess of metal, thereby further improving the surface flatness of the A-plane group III nitride semiconductor layer formed thereon. In addition, the distribution of island-like crystals is not required to be excessively dense, but rather may be in the form of a structure in which the substrate surface is visible between the crystalline masses. In this case, since regions having different crystal growth rates are present on the surface, threading dislocation density decreases due to the effects of selective growth, and better crystals of the A-plane group III nitride semiconductor layer can be produced.

In addition, buffer layer 2 is preferably composed of columnar crystalline masses. Namely, buffer layer 2 is preferably composed of columnar crystal comprised of aggregates of columnar grains having a width of about 0.1 to 100 nm and height of about 10 to 500 nm. The columnar crystals are preferably adhered to the substrate so that their lateral plane is roughly perpendicular to substrate plane. Composing the buffer layer with columnar crystals is thought to facilitate the retention of metallic crystals and liquid droplets therein due to the increased number of grain boundaries in the crystal layer, which has the effect of allowing the buffer layer to function as a layer having a greater excess of metal, thereby further improving the surface flatness of the A-plane group III nitride semiconductor layer formed thereon.

The crystal status of the buffer layer can be identified by observing a cross-section of the resulting group III nitride semiconductor stacked structure with a transmission electron microscope (TEM).

In the present invention, lattice mismatched crystal epitaxial growth technology disclosed in, for example, Japanese Unexamined Patent Publication No. 2003-243302 is preferably used in the first step for forming buffer layer 2. This method, which is used to produce an AlN crystal film at a high temperature enabling production of group III nitride semiconductor crystals, is an epitaxial growth technology suitable for not only C-plane sapphire, but also R-plane sapphire.

In the first step of the present invention, a group III nitride semiconductor is formed by supplying a group V raw material such as ammonia, alkyl amine or hydrazine simultaneously to a group III raw material. In the present invention, the V/III ratio when supplying the group III raw material in the first step is 200 or less, preferably 150 or less, and more preferably 100 or less. As a result of setting the V/III ratio in this manner, it becomes easier to form compound semiconductor crystals having a greater excess of metal, and the buffer layer is composed of columnar crystals, thereby resulting in the effect of improving the surface flatness of the A-plane group III nitride semiconductor crystals stacked thereon.

In the present invention, the V/III ratio may be zero, namely the amount of group V raw material supplied may be zero. In this case, however, even if the amount of group V raw material supplied is intentionally made to be zero, it is necessary that a group III nitride semiconductor be formed from nitrogen supplied from decomposition of adhered substance adhered to the walls, ceiling, susceptor and so forth of the reactor. In this case, it is necessary to properly control the composition and amount of substances adhered to the walls, ceiling, susceptor and so forth of the reactor. More specifically, this consists of adjusting the baking time and temperature of the reactor following completion of growth or terminating baking itself. In addition, the time and temperature of a process referred to as thermal cleaning, which is a common technology used for growth using a low-temperature buffer method, is adjusted or the process itself is terminated. For example, after carrying out thermal cleaning for 10 minutes at 600° C. without baking following the previous growth cycle, the substrate is heated to 1150° C. and only a metal-containing compound is introduced in a first step, followed by crystal growth in a second step, thereby allowing the production of satisfactory A-plane group III nitride semiconductor crystals.

In the first step of the present invention, hydrogen, a noble gas or nitrogen and so forth can be used alone or as a mixed gas for the atmospheric gas. In the case of using nitrogen for the atmospheric gas, the nitrogen gas may also function as a raw material gas.

In addition, the pressure of the atmospheric gas when carrying out the first step can be 1 to 100 kPa, preferably 100 kPa or less, and more preferably 10 kPa or less. If the pressure in the first step is low, the surface of the buffer layer produced becomes flat, resulting in the effect of facilitating flattening of the surface of the underlying layer composed of the A-plane group III nitride semiconductor to be grown thereon.

In addition, in the present invention, although there are no particular limitations on the temperatures of the substrate when carrying out the first and second steps, the temperature of the substrate when carrying out the first step is preferably equal to or higher than the temperature of the substrate when carrying out the following second step. By making the substrate temperature higher in the first step than in the second step, decomposition of the group III raw material gas in the form of molecules of an organometallic compound proceeds efficiently, thereby offering the advantage of the formed crystals not containing impurities caused by non-decomposed alkyl groups and so forth. In addition, making the substrate temperature in the first step higher than that in the second step tends to result in satisfactory flatness for the surface of the A-plane group III nitride semiconductor layer stacked in the second step.

In the present invention, as for an A-plane group III nitride semiconductor, of which an underlying layer is composed, numerous Group III nitride semiconductors are known, such as those represented by the general formula $Al_XGa_YIn_ZN_{1-a}M_a$ ($0 \leq X \leq 1, 0 \leq Y \leq 1, 0 \leq Z \leq 1$ and $X+Y+Z=1$, wherein M represents a Group V element different from nitrogen (N), and $0 \leq a < 1$) and, according to the invention, there may be used, without any particular restrictions, Group III nitride semiconductors represented by the general formula $Al_XGa_YIn_ZN_{1-a}M_a$ ($0 \leq X \leq 1, 0 \leq Y \leq 1, 0 \leq Z \leq 1, X+Y+Z=1$. M represents a Group V element different from nitrogen (N) and $0 \leq a < 1$), which include the aforementioned well-known Group III nitride semiconductors. Among them, GaN is preferable from the viewpoint of the surface flatness of the resulting underlying layer. Here, an A-plane group III nitride semiconductor refers to the (11-20) plane of a group III nitride semiconductor crystal.

The thickness of the underlying layer is such that, the smaller the thickness the lower the production costs provided that it has superior surface flatness. According to the production method of the present invention, an underlying layer is obtained having extremely superior surface flatness in the form of a surface pit density of $1 \times 10^{10}$ cm$^{-2}$ or less at a thickness of 20 μm or less. The thickness of the underlying layer is more preferably 10 μm or less, and particularly preferably 5 μm or less. In addition, as surface flatness deteriorates if the underlying layer is excessively thin, the thickness of the underlying layer is also preferably 1 μm or more, and more preferably 3 μm or more.

In consideration of the crystallinity of the group III nitride semiconductor layer which composes the device formed thereon, the pit density of the underlying layer surface is required to be at least $1 \times 10^{10}$ cm$^{-2}$ or less, and preferably $5 \times 10^9$ cm$^{-2}$ or less.

Pit density of the underlying layer surface can be measured by an atomic force microscope (AFM). In the present invention, pit density is calculated by using a measuring area of 5×5 μm, and determining the mean of 5 points within the same plane.

In the second step of the present invention for forming the underlying layer, A-plane group III nitride semiconductor crystals are grown in the vapor phase on the substrate on which the buffer layer was formed in the first step using a group III raw material and a nitrogen raw material. The use of GaN for the group III nitride semiconductor crystals to be grown is preferable because it is the most easily two-dimensionally grown crystal among all group III nitride semiconductors, thereby facilitating the formation of a flat crystal film. Once a crystal film having satisfactory flatness has been grown with GaN, semiconductor device structures can be produced easily thereon using various compositions of group III nitride semiconductor crystal layers.

Ammonia (NH$_3$) is preferable for the nitrogen raw material used in the second step because it is a gas, is easily handled, is readily available commercially and is inexpensive. Examples of group III raw materials which can be used include trimethyl aluminum, triethyl aluminum, tertiary butyl aluminum, trimethyl gallium, triethyl gallium, tertiary butyl gallium, trimethyl indium, triethyl indium, tertiary butyl indium and cyclopentadienyl indium. In addition, the V/III ratio when growing the A-plane group III nitride semiconductor crystals in the second step is preferably 500 to 20,000, more preferably 500 to 2,000, and the smaller the V/III ratio, the greater the inhibition of the formation of pits, thereby improving surface flatness.

It is necessary to increase the substrate temperature in the second step in stages in order to increase the flattening rate of underlying layer 3 composed of an A-plane group III nitride semiconductor (or in other words, to obtain a thin film with satisfactory uniformity). Growth at a low temperature only can not inhibit the formation of pits resulting in pits remaining on the surface and poor flatness. On the other hand, carrying out growth at a high temperature from the start of the second step is not preferable since it causes roughening of the surface of the group III nitride semiconductor crystals. It is important to start growth at a low temperature in the second step. As a result of starting growth at a low temperature, wettability between the buffer layer of the first step and the A-plane group III nitride semiconductor crystals becomes satisfactory, thereby demonstrating the effect of absorbing dislocations caused by lattice mismatch. If a high temperature is used from the start of growth, dislocations cannot be absorbed, thereby resulting in poor crystallinity. By starting growth at a low temperature, and then raising the substrate temperature after dislocations have been absorbed to a certain degree, two-dimensional growth by flattening is promoted, thereby reducing the formation of pits and improving flatness.

For example, when the substrate temperature in the first stage of the second step is designated as T1, the substrate temperature in the second stage is designated as T2, and the substrate temperature in the third stage is designated as T3, then crystals are grown such that 700° C.<T1<1050° C., 1000° C.<T2<1100° C., 1100° C.<T3<1200° C., and T1<T2<T3.

The atmospheric pressure in the second step is preferably from 1 to 100 kPa, and more preferably from 10 to 100 kPa.

In the present invention, A-plane group III nitride semiconductor crystals having low pit density and satisfactory crystallinity can be grown on an R-plane sapphire substrate according to a production method of group III nitride semiconductor crystals having the aforementioned first and second steps. Moreover, by forming a group III nitride semiconductor crystal layer thereon, group III nitride semiconductor epitaxial wafers having a stacked structure can be produced which are used for the production of light-emitting diodes, laser diodes or electronic devices.

The following provides an explanation of a light-emitting device provided with an n-type layer, a light-emitting layer and a p-type layer, which are composed of a group III nitride semiconductor, in that order on a group III nitride semiconductor stacked structure of the present invention as an application example thereof.

The n-type layer is usually composed of an n-type contact layer and n-type clad layer. The n-type contact layer is preferably composed of an $Al_xGa_{1-x}N$ layer ($0 \leq x \leq 1$, preferably $0 \leq x \leq 0.5$). It is preferably doped with an n-type impurity, and preferably the n-type impurity concentration is $1 \times 10^{17}$-$1 \times 10^{19}/cm^3$ and more preferably $1 \times 10^{18}$-$1 \times 10^{19}/cm^3$, from the standpoint of maintaining satisfactory ohmic contact with the n-ohmic electrode, controlling generation of cracks and maintaining satisfactory crystallinity. There are no particular restrictions on the n-type impurity and, as examples, there may be mentioned Si, Ge and Sn, among which Si and Ge are preferred.

An n-type clad layer is preferably provided between the n-type contact layer and light-emitting layer, because it can fill areas of distorted flatness of the outermost surface of the n-type contact layer. The n-type clad layer may be formed of AlGaN, GaN, GaInN or the like. There may also be formed a super lattice structure as a hetero-junction or multiple lamination of these structures. When GaInN is used, it is naturally preferred for it to have a larger band gap than the GaInN of the light-emitting layer.

The thickness of the n-type clad layer is not particularly restricted, but is preferably 0.005-0.5 μm and more preferably 0.005-0.1 μm. The n-type dope concentration of the n-type clad layer is preferably $1 \times 10^{17}$-$1 \times 10^{20}/cm^3$ and more preferably $1 \times 10^{18}$-$1 \times 10^{19}/cm^3$. A dope concentration within this range is preferred from the standpoint of maintaining satisfactory crystallinity and lowering the operating voltage of the device.

The light-emitting layer is a Group III nitride semiconductor, and preferably the Group III nitride semiconductor $Ga_{1-s}In_sN$ ($0<s<0.4$). The thickness of the light-emitting layer is not particularly restricted, but a thickness obtained by a quantum effect, i.e. a critical film thickness, is suitable, and the thickness is preferably, for example, 1-10 nm and more preferably 2-6 nm. A thickness within this range is preferred from the standpoint of emission output. If the thickness is greater than the critical thickness, the lattice constant shift between the n-type layer and light-emitting layer will increase, impairing the emission characteristics. The light-emitting layer may have a single quantum well (SQW) structure as described above, or a multiple quantum well (MQW) structure comprising the aforementioned $Ga_{1-s}In_sN$ as the well layer and an $Al_cGa_{1-c}N$ ($0 \leq c < 0.3$) barrier layer with a larger band gap energy than the well layer. The well layer and barrier layer may also be doped with impurities.

The growth temperature of the $Al_cGa_{1-c}N$ barrier layer is preferably a temperature of at least 700° C. and more preferably 800-1100° C., for satisfactory crystallinity. The GaInN well layer is preferably grown at 600-900° C. and more preferably 700-900° C. That is, the growth temperature is preferably varied between layers for satisfactory MQW crystallinity.

The p-type layer is normally composed of a p-type clad layer and a p-type contact layer. The p-type clad layer is not particularly restricted so long as it has a composition with a larger band gap energy than the light-emitting layer and encloses the carrier in the light-emitting layer, but it is preferably $Al_dGa_{1-d}N$ ($0<d \leq 0.4$) A p-type clad layer composed of this type of AlGaN is preferred from the standpoint of enclosing the carrier in the light-emitting layer. The thickness of the p-type clad layer is not particularly restricted, but is preferably 0.01-0.4 μm. The p-type dope concentration of the p-type clad layer is preferably $1 \times 10^{18}$-$1 \times 10^{21}/cm^3$ and more preferably $1 \times 10^{19}$-$1 \times 10^{20}/cm^3$. A p-type dope concentration within this range will yield a satisfactory p-type crystal without a reduction in crystallinity.

The p-type contact layer is a Group III nitride semiconductor layer comprising at least $Al_eGa_{1-e}N$ ($0 \leq e < 0.3$). An Al composition within this range is preferred from the standpoint of maintaining satisfactory crystallinity and satisfactory ohmic contact with the p-ohmic electrode. A p-type dopant concentration of $1 \times 10^{18}$-$1 \times 10^{21}/cm^3$ and especially $5 \times 10^{19}$-$5 \times 10^{20}/cm^3$ is preferred from the standpoint of maintaining satisfactory ohmic contact, preventing generation of cracks and maintaining satisfactory crystallinity. The p-type impurity is not particularly restricted, but Mg, for example, is preferred. The thickness is also not particularly restricted, but is preferably 0.01-0.5 μm. A thickness within this range is preferred from the standpoint of emission output.

The n-type contact layer and p-type contact layer are provided with an n-ohmic electrode and p-ohmic electrode, respectively, by well-known means employed in this technical field. The structure of each may be any structure including conventionally publicly known structures, without any restrictions.

As the Group III nitride semiconductor light-emitting device of the invention has excellent emission efficiency, it is possible to fabricate a high-brightness LED lamp from the light-emitting device. Thus, chips fabricated by this technique can be employed to allow low-power driving, and to thus realize superior characteristics, for electronic devices such as cellular phones, displays and panels, and machines and appliances such as automobiles, computers and game devices incorporating such electronic devices. A particular effect of power savings is exhibited for battery-driven devices such as cellular phones, game devices, gadgets and automobile parts.

EXAMPLES

The present invention will now be explained in greater detail through examples and comparative examples, with the understanding that these examples are in no way limitative on the invention.

Example 1

Figure 2:
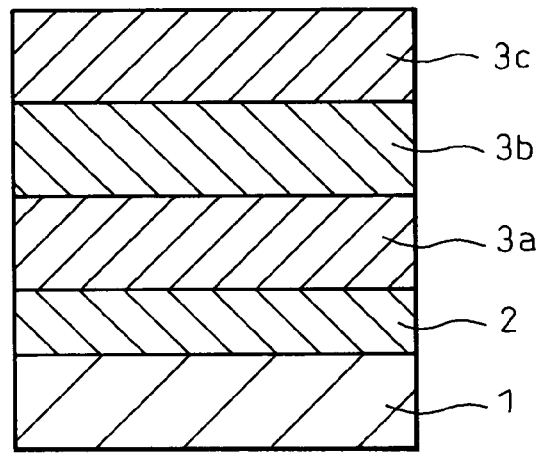
FIG. 2 is a schematic drawing showing the cross-section of the Group III nitride semiconductor stacked structure fabricated in Example 1.
Figure 3:
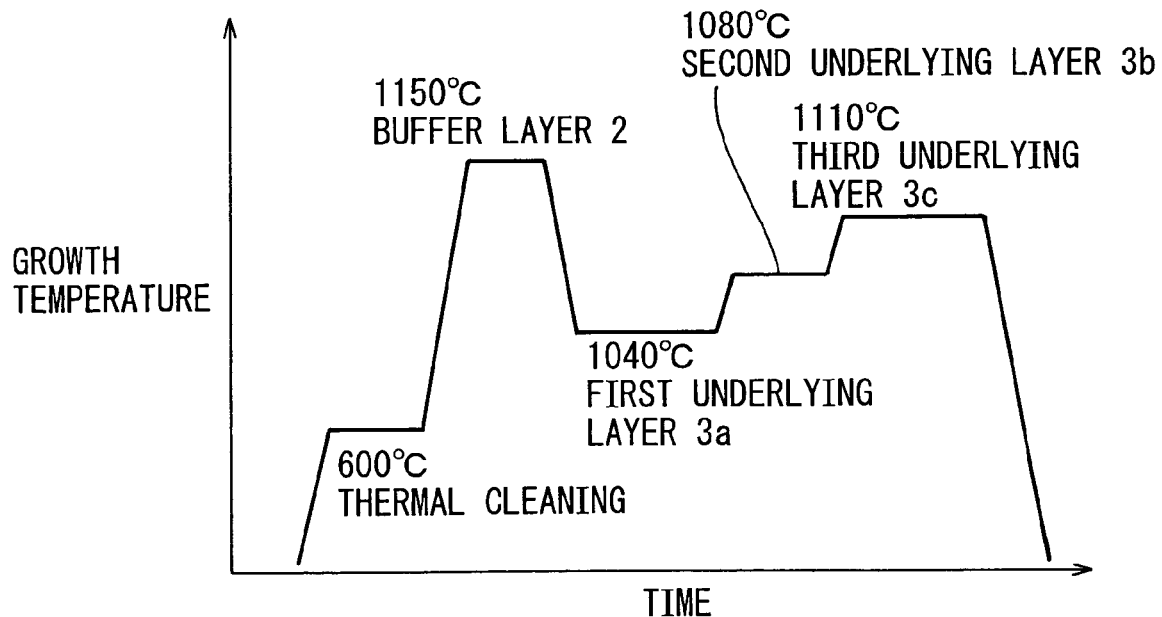
FIG. 3 is a graph showing the temperature profile of each step in Example 1.

FIG. 2 is a schematic drawing showing a cross-section of a group III nitride semiconductor stacked structure produced in the present example, while FIG. 3 is a graph showing the temperature profile of each step in the present example. The aforementioned structure was formed in the order indicated below using a typical reduced-pressure MOCVD. First, an R-plane sapphire substrate 1 was placed on a high-purity graphite semiconductor susceptor heated to a growth temperature with a radio-frequency (RF) induction heater. After placing the substrate on the susceptor, nitrogen gas was introduced into a stainless steel vapor phase growth reactor to purge the inside of the reactor.

After circulating nitrogen gas through the vapor phase growth reactor for 8 minutes, the induction heater was activated to raise the temperature of the substrate 1 from room temperature to 600° C. over a period of 10 minutes. Hydrogen gas and nitrogen gas were then circulated through while maintaining the temperature of the substrate 1 at 600° C., to adjust the pressure in the vapor phase growth reactor to 15 kPa. The surface of the substrate 1 was allowed to stand at this temperature and pressure for 2 minutes for thermal cleaning. Upon completion of thermal cleaning, the supply of nitrogen gas to the vapor phase growth reactor was interrupted. The supply of hydrogen gas was continued.

Next, the temperature of the substrate 1 was raised to 1150° C. in a hydrogen atmosphere. After confirming stabilization at the 1150° C. temperature, hydrogen gas accompanied by trimethylaluminum (TMAl) vapor was supplied to the vapor phase growth reactor for 15 minutes and 30 seconds. This resulted in reaction with the nitrogen (N) atoms produced by decomposition of the nitrogen (N)-containing accumulated precipitate already adhering to the inner wall of the vapor phase reactor, for formation of a buffer layer 2 composed of aluminum nitride (AlN) with a thickness of about 100 nanometers on the sapphire substrate 1. Supply of the hydrogen gas accompanied by TMAl vapor to the vapor phase growth reactor was terminated to complete growth of the buffer layer 2, after which a period of 4 minutes was allowed to pass for complete emission of the TMAl remaining in the vapor phase growth reactor. When surface orientation of the grown layer was evaluated by X-ray analysis, an (11-20) plane (A-plane) was found to have been grown.

Next, supply of ammonia ($NH_3$) gas into the vapor phase growth reactor was initiated, and after elapse of 4 minutes, the temperature of the susceptor was lowered to 1040° C. while continuing circulation of ammonia gas. Upon confirming that the temperature of the susceptor had reached 1040° C., the temperature was temporarily allowed to stabilize, and supply of trimethylgallium (TMGa) into the vapor phase growth reactor was initiated to form a first underlying layer 3a made of undoped GaN to the prescribed thickness. The thickness of the first underlying layer 3a was 1 µm. The V/III ratio at this time was 800.

Next, the temperature of the susceptor was raised to 1080° C. Upon confirming that the temperature of the susceptor had reached 1080° C., the temperature was temporarily allowed to stabilize, and supply of trimethylgallium (TMGa) into the vapor phase growth reactor was restarted to form a second underlying layer 3b made of undoped GaN to the prescribed thickness. The thickness of the second underlying layer 3b was 1 µm. The V/III ratio at this time was 800.

Next, the temperature of the susceptor was raised to 1100° C. Upon confirming that the temperature of the susceptor had reached 1100° C., the temperature was temporarily allowed to stabilize, and supply of trimethylgallium (TMGa) into the vapor phase growth reactor was restarted to form a third underlying layer 3c made of undoped GaN to the prescribed thickness. The thickness of the third underlying layer 3c was 2 µm. The V/III ratio at this time was 800.

Following growth of the aforementioned third underlying layer 3c, the valve of the TMGa line was switched to discontinue the supply of raw material into the reactor and stop the growth. Following completion of the growth of third underlying layer 3c, power to the induction heater was turned off, and the substrate temperature was lowered to room temperature over the course of 20 minutes. Although the atmosphere inside the reactor while the temperature was lowering was composed of ammonia, nitrogen and hydrogen in the same manner as during growth, after confirming that the substrate temperature had fallen to 400° C., the supply of ammonia and hydrogen was discontinued. Subsequently, the substrate temperature was lowered to room temperature while introducing nitrogen gas, after which the sample was removed into air.

According to the aforementioned process, the GaN layer was formed on the R-plane sapphire substrate 1 with the AlN buffer layer 2 interposed between. The grown surface was mirrorlike. When surface orientation of the grown GaN layer was evaluated by X-ray analysis, (11-20) plane (A-plane) GaN was found to have been grown similarly to AlN.

Next, the X-ray rocking curve (XRC) was measured to evaluate the crystallinity of undoped GaN layer grown in the manner described above. A Cuβ-ray X-ray generator was used as the X-ray source, and measurement was carried out in a symmetrical plane in the form of the (11-20) plane and an asymmetrical plane in the form of the (0002) plane. In the case of growing GaN on R-plane sapphire, the Full Width at Half Maximum (FWHM) of the XRC spectrum in the (11-20) plane serves as an indicator of crystallinity in the direction of growth, while FWHM of the XRC spectrum in the (0002) plane serves as an indicator of crystallinity in-plane growth. As a result, the undoped GaN layer produced using the process of the present invention demonstrated a FWHM of 400 arc sec during measurement in the (11-20) plane and a FWHM of 700 arc sec during measurement in the (0002) plane, and satisfactory values were obtained.

In addition, the surface of the aforementioned GaN layer was observed using an ordinary light microscope. As a result, although undulations in the surface were greater in comparison with GaN on C-plane sapphire, there were no growth pits observed on the surface, and satisfactory morphology was observed. A satisfactory GaN layer having a thickness of about 4 µm could be produced in the same manner as a C-plane sapphire substrate. In addition, determination of mean pit density by observing an area of 5 µm×5 µm with an atomic force microscope (AFM) yielded a result of about $1 \times 10^9 \, cm^{-2}$.

In addition, observation of a cross-section of the buffer layer with a transmission electron microscope (TEM) indicated the presence of an AlN film having a large number of grain boundaries in a direction roughly perpendicular to the sapphire substrate surface. The film thickness was about 100 nm, and the distance between grain boundaries ranged from 5 to 50 nm. This layer is thought to be composed of aggregates of long, columnar crystals.

Example 2

Figure 4:
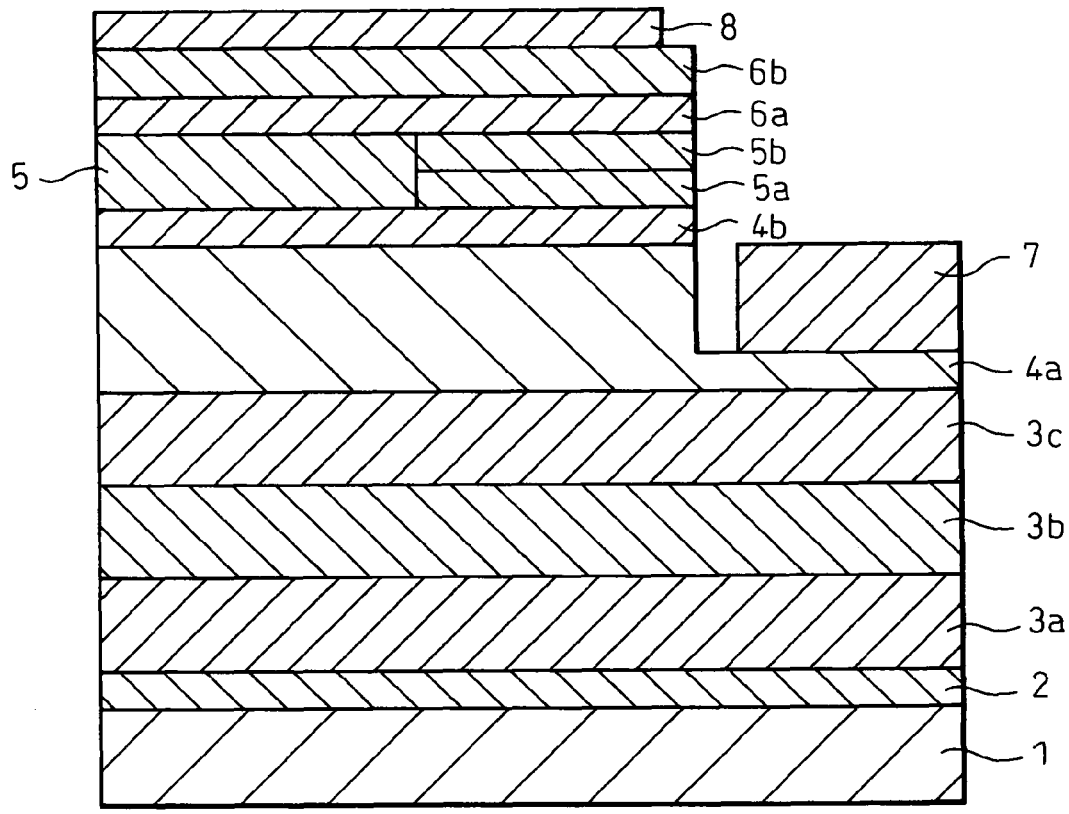
FIG. 4 is a drawing schematically showing a cross-section of the Group III nitride semiconductor light-emitting device produced in Example 2.

A group III nitride semiconductor layer was additionally stacked onto the stacked structure produced in Example 1 to produce a group III nitride semiconductor light-emitting device. FIG. 4 is a drawing schematically showing the cross-sectional structure of the group III nitride semiconductor light-emitting device produced in this example.

After producing the device through the third underlying layer 3c by repeating the procedure described in Example 1, an n-type contact layer 4a composed of Si-doped n-type GaN was formed. After stacking the n-type contact layer 4a, an n-type clad layer 4b composed of Si-doped n-type $In_{0.03}Ga_{0.97}N$ was stacked at 730° C. This n-type clad layer 4b was grown to a layer thickness of 12.5 nm using triethyl gallium (TEG) for the gallium source and trimethyl indium (TMI) for the indium source.

Next, a multi-quantum well structure light-emitting layer 5 having a pentacyclic structure, composed of a barrier layer 5a composed of GaN and a well layer 5b composed of $In_{0.25}Ga_{0.75}N$, was provided on n-type clad layer 4b at the substrate temperature of 730° C. In forming the structure of the multi-quantum well structure light-emitting layer 5, after first providing GaN barrier layer 5a by joining to n-type clad layer 4b, the well layer and barrier layer were repeatedly provided 5 times, with the final layer being a barrier layer.

GaN barrier layer 5a was grown using triethyl gallium (TEG) for the gallium source. The layer thickness was 15 nm and it was undoped. The $In_{0.25}Ga_{0.75}N$ well layer 5b was grown using triethyl gallium (TEG) for the gallium source and trimethyl indium (TMI) for the indium source. The layer thickness was 3.5 nm and it was also undoped.

On the light-emitting layer 5 having the multiple quantum well structure there was formed a p-type clad layer 6a made of magnesium (Mg)-doped p-type $Al_{0.07}Ga_{0.93}N$. The thickness was 10 nm. On the p-type clad layer 6a there was formed a p-type contact layer 6b made of Mg-doped p-type $Al_{0.03}Ga_{0.97}N$. Bis-cyclopentadienyl Mg (bis-$Cp_2$Mg) was used as the Mg doping source. The Mg was added in an amount for a positive hole concentration of $8 \times 10^{17}/cm^3$ in the p-type contact layer 6b. The thickness of the p-type contact layer 6b was 150 nm.

After completing growth of the p-type contact layer 6b, current to the induction heater was interrupted to allow the temperature of the substrate 1 to fall to room temperature over a period of about 20 minutes. During the temperature change, the atmosphere in the vapor phase growth reactor was composed of nitrogen alone. Upon confirming that the temperature of the substrate 1 had fallen to room temperature, the stacked structure was taken out from the vapor phase growth reactor. At this point, the p-type contact layer 6b already exhibited p-type conductivity without an annealing treatment for electrical activation of the p-type carrier (Mg).

Next, the n-type contact layer 4a was exposed only in the region where an n-type ohmic electrode was scheduled to be formed using known photolithography and ordinary dry etching technologies. The n-type ohmic electrode 7 stacked with titanium and gold (with titanium located on the semiconductor side) was formed on the exposed surface. A p-type ohmic electrode 8, stacked with nickel and gold in order from the semiconductor side, was formed over the entire surface of p-type contact layer 6b, which accounted for the remaining surface of the stacked structure, using a known photolithography means and so forth.

Subsequently, the structure was cut into square LED chips measuring 350 µm on a side, the chips were placed on a lead frame, and gold leads for a device driving current were connected to the lead frame.

The device driving current was introduced through the lead frame to the n-type ohmic electrode 7 and p-type ohmic electrode 8 in the forward direction. The forward voltage at a 20 mA forward current was 3.7 V. The center wavelength of emitted blue-band luminescence was 460 nm. The emission intensity as measured using an ordinary integrating sphere reached 5 mW, and therefore a Group III nitride semiconductor light-emitting device with high emission intensity had been obtained.

Comparative Example 1

Figure 5:
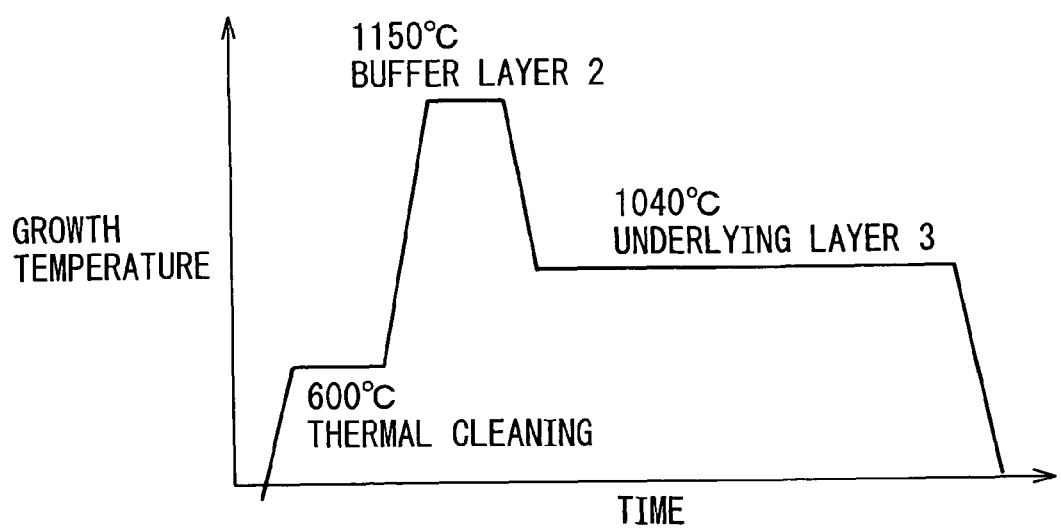
FIG. 5 is a graph showing the temperature profile of each step in Comparative Example 1.

A group III nitride semiconductor stacked structure was produced in the same manner as Example 1 with the exception of growing the GaN layer for forming the underlying layer to a thickness of 4 µm at a constant substrate temperature of 1040° C. Furthermore, FIG. 5 is a graph showing the temperature profile of each step in this comparative example. The surface of the resulting structure was cloudy and opaque, and as a result of observing by light microscopy, a large number of pits were seen to have formed in the surface of the GaN layer. Pit density was unable to be determined by AFM observation due to the large number of pits (>$10^{10}$ cm$^{-2}$).

Comparative Example 2

A group III nitride semiconductor stacked structure was produced in the same manner as Example 1 with the exception of growing the GaN layer for forming the underlying layer to a thickness of 10 µm at a constant substrate temperature of 1040° C. Although the surface of the resulting structure had a lower pit density than Comparative Example 1, a large number of growth pits had still been formed. The pit density was greater than $1 \times 10^{10}$ cm$^{-2}$ in the same manner as Comparative Example 1.

Comparative Example 3

A group III nitride semiconductor stacked structure was produced in the same manner as Example 1 with the exception of growing a GaN layer for forming the underlying layer to a thickness of 10 µm at a constant substrate temperature of 1110° C. The surface of the resulting structure was cloudy and opaque, and as a result of observing by light microscopy, the surface was observed to extremely rough without the formation of a continuous film.

As a group III nitride semiconductor stacked structure of the present invention has a high-quality A-plane group III nitride semiconductor layer on an R-plane sapphire substrate, it is extremely useful as a material for a light-emitting device and so forth.

What is claimed is:

1. A production method of a group III nitride semiconductor stacked structure comprising:
    a first step wherein a buffer layer composed of aluminum gallium nitride ($Al_xGa_{1-x}N$: $0 \leq X \leq 1$) is grown on a substrate composed of R-plane sapphire ($\alpha$-$Al_2O_3$);
    a second step wherein, an underlying layer composed of an A-plane undoped gallium nitride layer is grown on the buffer layer; and
    a third step wherein an n-type contact layer, an n-type clad layer, a light-emitting layer, a p-type clad layer and a p-type contact layer are grown on the underlying layer in this order;
    wherein, the substrate temperature of the second step is raised in three or more stages, and
    wherein when the substrate temperature in the first stage of the second step is designated as T1, the substrate temperature in the second stage is designated as T2, and the substrate temperature in the third stage is designated as T3, then 700° C.<T1<1050° C., 1000° C.<T2<1100° C., 1100° C.<T3<1200° C., and T1<T2<T3, and
    wherein the substrate temperature of the first step is higher than that of the second step.

2. The production method of a group III nitride semiconductor stacked structure according to claim 1, wherein the ratio of the group V element (nitrogen) to the group III element in the first step (V/III ratio) is 200 or less (including the case of the V/III ratio being zero).

3. The production method of a group III nitride semiconductor stacked structure according to claim 1, wherein the nitrogen raw material of the first step is a decomposition product of an adhered substance adhered inside a reactor.

4. The production method of a group III nitride semiconductor stacked structure according to claim 1, wherein the nitrogen raw material of the second step is ammonia ($NH_3$).

5. A group III nitride semiconductor stacked structure produced according to the production method according to claim 1.

* * * * *